(12) United States Patent
Arai et al.

(10) Patent No.: US 9,378,899 B2
(45) Date of Patent: Jun. 28, 2016

(54) PHOTOELECTRIC CONVERSION ELEMENT

(71) Applicants:Ryota Arai, Shizuoka (JP); Yuuji Tanaka, Shizuoka (JP); Tamotsu Horiuchi, Shizuoka (JP)

(72) Inventors: Ryota Arai, Shizuoka (JP); Yuuji Tanaka, Shizuoka (JP); Tamotsu Horiuchi, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/476,891

(22) Filed: Sep. 4, 2014

(65) Prior Publication Data

US 2015/0083226 A1    Mar. 26, 2015

(30) Foreign Application Priority Data

Sep. 26, 2013  (JP) ................................. 2013-199411

(51) Int. Cl.
*C08G 63/00* (2006.01)
*H01G 9/20* (2006.01)
(Continued)

(52) U.S. Cl.
CPC ............ *H01G 9/2059* (2013.01); *C09B 57/004* (2013.01); *H01L 51/0053* (2013.01); *H01L 51/0061* (2013.01); *H01G 9/2013* (2013.01); *H01G 9/2031* (2013.01); *H01L 51/0068* (2013.01); *H01L 2251/306* (2013.01); *Y02E 10/542* (2013.01)

(58) Field of Classification Search
CPC . C09B 57/004; H01L 51/0036; C08G 61/126
USPC ...................................................... 528/367.8
See application file for complete search history.

(56) References Cited

FOREIGN PATENT DOCUMENTS

| JP | 1-220380 | 9/1989 |
|---|---|---|
| JP | 11-086916 | 3/1999 |

(Continued)

OTHER PUBLICATIONS

Odobel et al.,Journal of Photochemistry and Photobiology A: Chemistry 226 (2011) 9-15.*

(Continued)

*Primary Examiner* — Shane Fang
(74) *Attorney, Agent, or Firm* — Cooper & Dunham LLP

(57) ABSTRACT

A photoelectric conversion element is provided. The photoelectric conversion element includes a first electrode and a second electrode. The first electrode is covered with an electron transport layer. The electron transport layer is covered with a material represented by the following formula (1):

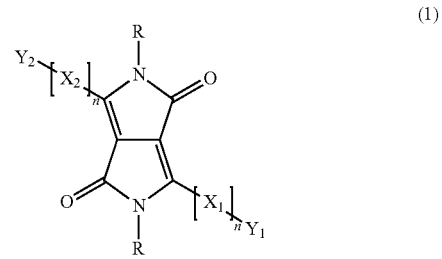

(1)

wherein R represents a straight-chain or branched-chain alkyl group, each of $X_1$ and $X_2$ independently represents a substituted or unsubstituted aromatic group, each of $Y_1$ and $Y_2$ independently represents an acidic group or hydrogen atom but at least one of $Y_1$ and $Y_2$ represents an acidic group, and n represents an integer of from 1 to 3. The second electrode is facing the electron transport layer.

6 Claims, 6 Drawing Sheets

(51) Int. Cl.
 *H01L 51/00* (2006.01)
 *C09B 57/00* (2006.01)

(56) References Cited

FOREIGN PATENT DOCUMENTS

| JP | 11-238925 | 8/1999 |
|---|---|---|
| JP | 2007-013115 | 1/2007 |

OTHER PUBLICATIONS

Tang et al. (Solar Energy 86 (2012) 2306-2311).*

Brian O'Regan, et al., A low-cost, high-efficiency solar cell based on dye-sensitized colloidal TiO2 films, Oct. 24, 1991, Nature vol. 353, pp. 737-740.

Nazeerfuddin, et al., Conversion of Light to Electricity, Apr. 7, 1992, J. Am. Chem. Soc., vol. 115, No. 14, 1993, pp. 6382-6390.

Kazuhiro Sayama, et al. Photosensitization of Porous TiO2 Semiconductor Electrode with Xanthene Dyes, Apr. 28, 1998, Chemistry Letters 1998, pp. 753-754.

Suzanne Ferrere, et al., Dye Sensitization of Nanocrystalline Tin Oxide by Perylene Derivatives, Feb. 25, 1997, J. Phys. Chem. B 1997, 101, pp. 4490-4493.

Hohjiro Hara, et al., A coumarin-derivative dye sensitized nanocrystalline TiO2 solar cell having a high solar-energy conversion efficiency up to 5.6%, Chem. Commun., 2001, pp. 569-570.

Kohjiro Hera, et al., Novel polyene dyes for highly efficient dye-sensitized solar cells, Oct. 24, 2002, Chem, Commun., 2003, pp. 252-253.

K. Kalynasundaram, et al. Sensitization of Tio2 in the Visible Light Region Using Zinc Porphyrins, Nov. 13, 1986, J. Phys. Chem. 1987, 91, pp. 2342-2347.

Yao-chun Shen, et al. Fabrication, characterization and photovoltaic study of a TiO2 microporous electrode, Feb. 11, 1994, Thin Solid Films 257 (1995) pp. 144-146.

Thomas W. Holcombe, et al., A structural study of DPP-based sensitizers for DSC applications, Jul. 17, 2012, Chem. Commun., 2012, 48, pp. 10724-10726.

* cited by examiner

PHOTOELECTRIC CONVERSION ELEMENT

CROSS-REFERENCE TO RELATED APPLICATIONS

This patent application is based on and claims priority pursuant to 35 U.S.C. §119(a) to Japanese Patent Application No. 2013-199411, filed on Sep. 26, 2013, in the Japan Patent Office, the entire disclosure of which is hereby incorporated by reference herein.

BACKGROUND

1. Technical Field

The present disclosure relates to a photoelectric conversion element.

2. Description of the Related Art

In recent years, solar cells are growing in importance as alternative energy to fossil fuels and measures against global warming. Existing solar cells, represented by silicone solar cells, are too expensive to be in widespread use.

Low-cost solar cell technologies are under research and development. For example, Graetzel et al. (from Swiss Federal Institute of Technology in Lausanne) have presented a dye-sensitized solar cell. This solar cell consists of a transparent conductive glass substrate, a porous metal oxide semiconductor provided on the substrate, a sensitizing dye adsorbed to the surface of the semiconductor, an electrolyte having a redox pair, and an opposite electrode. This solar cell has been notably improved in photoelectric conversion efficiency because of the increased surface area of the metal oxide semiconductor electrode, such as titanium oxide, owing to its porous configuration, and monomolecular adsorption of a ruthenium complex as the sensitizing dye.

However, the ruthenium complex, used as the sensitizing dye, is a rare metal having resource constraint issue. For this reason, organic sensitizing dyes free from resource constraint issue are demanded.

Various dyes have been proposed as sensitizing dyes for use in photoelectric conversion elements but none of them has sufficient characteristics.

SUMMARY

In accordance with some embodiments, a photoelectric conversion element is provided. The photoelectric conversion element includes a first electrode and a second electrode. The first electrode is covered with an electron transport layer. The electron transport layer is covered with a material represented by the following formula (1):

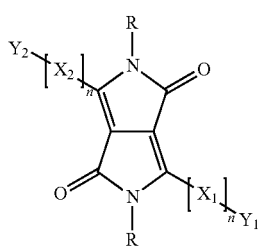

(1)

wherein R represents a straight-chain or branched-chain alkyl group, each of $X_1$ and $X_2$ independently represents a substituted or unsubstituted aromatic group, each of $Y_1$ and $Y_2$ independently represents an acidic group or hydrogen atom but at least one of $Y_1$ and $Y_2$ represents an acidic group, and n represents an integer of from 1 to 3. The second electrode is facing the electron transport layer.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
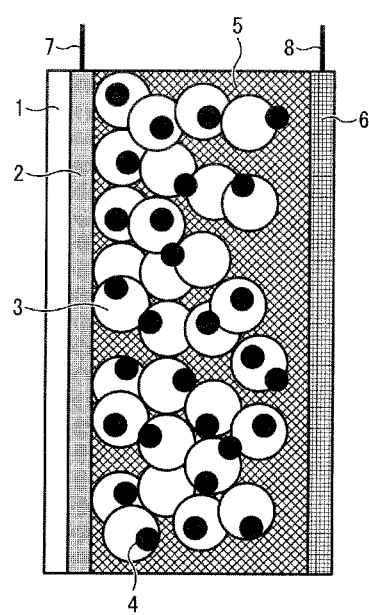
FIG. 1 is a cross-sectional of the photoelectric conversion element according to an embodiment.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

One object of the present invention is to solve the above-described problems and provide a photoelectric conversion element having high efficiency and long-term stability.

The inventors of the present invention have discovered that a photoelectric conversion element in which an electron transport layer on the first electrode is covered with a specific sensitizing dye delivers high performance.

The photoelectric conversion element according to an embodiment of the invention provides a dye-sensitized solar cell with excellent properties.

Configuration of the photoelectric conversion element according to an embodiment is described in detail with reference to FIG. 1.

FIG. 1 is a cross-sectional view of the photoelectric conversion element according to an embodiment.

A first electrode 2 is provided on a substrate 1. A photosensitizing compound 4 is adsorbed to an electron transport layer 3. A charge transfer layer 5 is sandwiched between the electron transport layer 3 and a second electrode 6 facing the electron transport layer 3.

First Electrode

The first electrode 2 consists of a visible-light-transmissive conductive substance generally used for photoelectric conversion elements and liquid crystal panels.

Specific examples of such substance include, but are not limited to, indium-tin oxide (ITO), fluorine-doped tin oxide (FTO), antimony-doped tin oxide (ATO), indium-zinc oxide, niobium-titanium oxide, and graphene. These substances can be used alone to form a monolayer or in combination to form a multilayer.

The first electrode preferably has a thickness of from 5 nm to 100 μm and more preferably from 50 nm to 10 μm.

To maintain rigidity of the first electrode at a constant level, it is preferable that the first electrode is formed on a substrate consisting of a visible-light-transmissive material such as glass, transparent plastic plate, transparent plastic film, and inorganic transparent crystalline body.

The first electrode and substrate may be integrally combined. For example, FTO-coated glass, ITO-coated glass, zinc-oxide-and-aluminum-coated glass, FTO-coated transparent plastic film, and ITO-coated transparent plastic film can be used as a combination of the first electrode and substrate.

In addition, a transparent electrode in which tin oxide or indium oxide is doped with cation or anion having a different atomic valence, or a metallic electrode having a mesh-like or stripe-like structure to be light transmissive, formed on a substrate such as glass substrate, can also be used. These materials can be used alone or in combination. These materials can be laminated.

For the purpose of reducing resistance, metallic lead wires 7 and 8 may be used in combination. Specific examples of material for the metallic lead wire include, but are not limited to, aluminum, copper, silver, gold, platinum, and nickel. The metallic lead wire may be provided to the substrate by means of vapor deposition, sputtering, pressure bonding, etc., and ITO or FTO may be provided thereon.

Electron Transport Layer

In the photoelectric conversion element according to an embodiment, a thin layer of a semiconductor is formed on the first electrode 2 as the electron transport layer 3.

The electron transport layer 3 may take a stacking structure consisting of a dense electron transport layer formed on the first electrode 2 and a porous electron transport layer further formed thereon.

The dense electron transport layer is formed for the purpose of preventing the first electrode 2 from electronically contacting the charge transfer layer 5. Accordingly, formation of pin holes and cracks thereon are acceptable unless the first electrode 2 is in physical contact with the charge transfer layer 5.

The dense electron transport layer is not limited in thickness but preferably has a thickness of from 10 nm to 1 μm and more preferably from 20 to 700 nm.

The term "dense" here refers to a situation in which the "dense" electron transport layer is filled with inorganic oxide semiconductor particles at a higher density than the porous electron transport layer.

The porous electron transport layer formed on the dense electron transport layer may be either monolayer or multilayer.

In the latter case, multiple dispersion liquids containing semiconductor particles of different particle diameters may be applied multiply, or multiple layers of different kinds of semiconductors or different compositions of resins and additives may be applied multiply. When the thickness is insufficient as a result of single application, multiple applications is effective.

Generally, as the thickness of the electron transport layer increases, light capture rate increases, because the amount of carrying photosensitizing compounds per unit projected area increases. However, diffusion distance of injected electrons also increases to increase loss due to recombination of charge. Accordingly, the electron transport layer 3 preferably has a thickness of from 100 nm to 100 μm.

Specific examples of the semiconductor include, but are not limited to, single-body semiconductors such as silicon and germanium, compound semiconductors such as metal chalcogenides, and compounds having a perovskite structure.

Specific examples of the metal chalcogenides include, but are not limited to, oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium.

Specific examples of the compound semiconductors include, but are not limited to, phosphides of zinc, gallium, iridium, and cadmium; gallium arsenide; copper-indium selenide; and copper-indium sulfide.

Specific examples of the compounds having a perovskite structure include, but are not limited to, strontium titanate, calcium titanate, sodium titanate, barium titanate, and potassium niobate.

Among these materials, n-type oxide semiconductors are preferable, and titanium oxide, zinc oxide, tin oxide, and niobium oxide are more preferable. These materials can be used alone or in combination. The semiconductor is not limited in crystal type and may be either single crystalline, polycrystalline, or amorphous.

The semiconductor particle is not limited in size but preferably in the form of nanoparticle having an average particle diameter of from 1 to 100 nm, more preferably from 5 to 50 nm.

It is possible to further improve efficiency by mixing or stacking another semiconductor particle having a greater average particle diameter to make incident light scatter. In this case, the semiconductor preferably has an average particle diameter of from 50 to 500 nm.

The electron transport layer is not limited in production method and can be produced by, for example, methods of forming thin layer in vacuum, such as sputtering, and wet film-forming methods.

In view of production cost, wet film-forming methods are preferable. Specifically, a method including preparing a paste in which powder or sol of semiconductor particle is dispersed and applying the paste to an electron collecting electrode substrate is preferable. This wet film-forming method is not limited in application method.

Specific examples of the application method include, but are not limited to, dip method, spray method, wire bar method, spin coat method, roller coat method, blade coat method, gravure coat method, and wet printing methods such as relief, offset, gravure, intaglio, rubber plate, and screen printings.

A dispersion liquid may be prepared by means of mechanical pulverization or mill, specifically by dispersing at least a semiconductor particle alone or a mixture of a semiconductor particle with a resin in water or an organic solvent.

Specific examples of the resin include, but are not limited to, homopolymers and copolymers of vinyl compounds such as styrene, vinyl acetate, acrylate, and methacrylate; and silicone resin, phenoxy resin, polysulfone resin, polyvinyl butyral resin, polyvinyl formal resin, polyester resin, cellulose ester resin, cellulose ether resin, urethane resin, phenol resin, epoxy resin, polycarbonate resin, polyarylate resin, polyamide resin, and polyimide resin.

Specific examples of solvents for dispersing semiconductor particle include, but are not limited to, water; alcohol solvents such as methanol, ethanol, isopropyl alcohol, and α-terpineol; ketone solvents such as acetone, methyl ethyl ketone, and methyl isobutyl ketone; ester solvents such as ethyl formate, ethyl acetate, n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These solvents can be used alone or in combination as a mixed solvent.

To prevent reaggregation of particles in a dispersion liquid of semiconductor particle or a paste of semiconductor particle obtained by sol-gel method, etc., an acid (e.g., hydrochloric acid, nitric acid, acetic acid), a surfactant (e.g., polyoxyethylene(10) octyl phenyl ether), or a chelator (e.g. acetyl acetone, 2-aminoethanol, ethylenediamine) can be added thereto.

To improve film-forming performance, a thickener can also be added.

Specific examples of the thickener include, but are not limited to, polymers such as polyethylene glycol and polyvinyl alcohol, and ethyl cellulose.

It is preferable that semiconductor particles having been applied are brought into electronic contact with each other and exposed to burning, microwave irradiation, electron beam irradiation, or laser light irradiation, for increasing the film strength and adhesion to the substrate. These treatments can be conducted alone or in combination.

In the burning, the burning temperature is preferably from 30 to 700° C., more preferably from 100 to 600° C., because excessively high temperatures increase the resistance of the substrate or cause melting of the substrate, but is not limited thereto. The burning time is preferably from 10 minutes to 10 hours, but is not limited thereto.

After the burning, for the purpose of increasing the surface area of the semiconductor particles as well as increasing the efficiency of electron injection from the photosensitizing compound to the semiconductor particles, a chemical plating treatment using an aqueous solution of titanium tetrachloride or a mixed solution with an organic solvent, or an electrochemical plating treatment using an aqueous solution of titanium trichloride may be conducted.

In the microwave irradiation, the electron transport layer may be irradiated from either the layer-formed side or the opposite side thereof.

The irradiation time is preferably within 1 hour, but is not limited thereto.

A layer in which semiconductor particles having a diameter of several tens nanometers are stacked by sintering, etc., forms a porous structure. Such a nano porous structure has a very large surface area. The surface area can be represented by a roughness factor. The roughness factor is a numerical value indicating the ratio of the actual area of the inside of the porous structure to the surface area of the semiconductor particles applied to the substrate. Accordingly, the higher the roughness factor, the better. In connection with the thickness of the electron transport layer, the roughness factor is preferably 20 or more.

Photosensitizing Compound

A photosensitizing compound is adsorbed to a surface of an electron transportable semiconductor for enhancing conversion efficiency. According to an embodiment, the photosensitizing compound is represented by the formula (1), preferably the formula (2), and more preferably the formula (3).

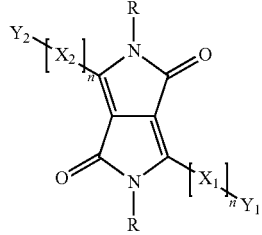

(1)

In the formula (1), R represents a straight-chain or branched-chain alkyl group, each of $X_1$ and $X_2$ independently represents a substituted or unsubstituted aromatic group, each of $Y_1$ and $Y_2$ independently represents an acidic group or hydrogen atom but at least one of $Y_1$ and $Y_2$ represents an acidic group, and n represents an integer of from 1 to 3.

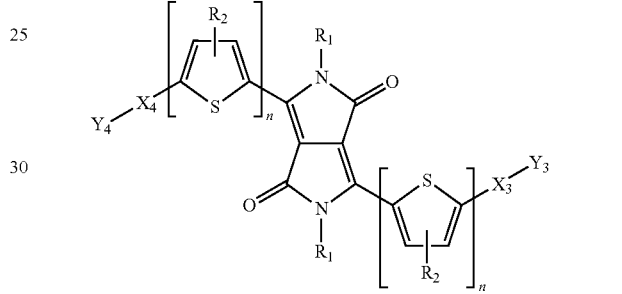

(2)

In the formula (2), each of $R_1$ and $R_2$ independently represents a straight-chain or branched-chain alkyl group, each of $X_3$ and $X_1$ independently represents a substituted or unsubstituted arylene group or hydrogen atom, each of $Y_3$ and $Y_4$ independently represents an acidic group selected from Y-1, Y-2, Y-3, Y-4, and Y-5 (described later) or hydrogen atom but at least one of $Y_3$ and $Y_4$ represents an acidic group, and n represents an integer of from 1 to 3. When $X_3$ represents hydrogen atom, $Y_3$ represents nothing. When $X_4$ represents hydrogen atom, $Y_4$ represents nothing.

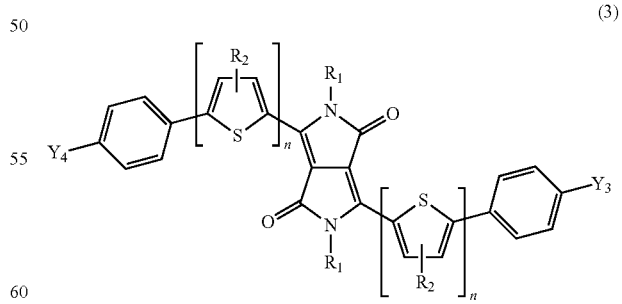

(3)

In the formula (3), each of $R_1$ and $R_2$ independently represents a straight-chain or branched-chain alkyl group, each of $Y_3$ and $Y_4$ independently represents an acidic group selected from Y-1, Y-2, Y-3, Y-4, and Y-5 (described later), and n represents an integer of from 1 to 3.

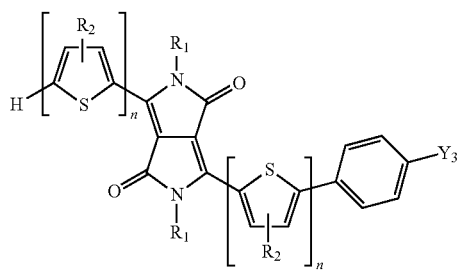 (4)

In the formula (4), each of $R_1$ and $R_2$ independently represents a straight-chain or branched-chain alkyl group, $Y_3$ represents an acidic group selected from Y-1, Y-2, Y-3, Y-4, and Y-5 (described later), and n represents an integer of from 1 to 3.

Specific examples of the aromatic group in the formula (1) include, but are not limited to, aromatic hydrocarbon groups such as phenylene group, 2-naphthylene group, and 9-anthrylene group; 2-thienylene group; 2-thiazolylene group; and 1,3,4-benzothiadiazolylene group. Nitrogen atom may have an alkyl group or an aryl group as a substituent. Specific examples of the alkyl group include, but are not limited to, methyl group, ethyl group, isopropyl group, n-hexyl group, 2-ethylhexyl group, 2-heptyl group, and vinyl group. Specific examples of the aryl group include, but are not limited to, phenyl group, 2-naphthyl group, p-tolyl group, and 4-methoxyphenyl group.

Specific examples of the arylene group in the formula (2) include, but are not limited to, aromatic hydrocarbon groups such as phenylene group, 2-naphthylene group, and 9-anthrylene group. Specific examples of the straight-chain or branched-chain alkyl group in the formulae (1) to (4) include, but are not limited to, alkyl groups having a carbon number of from 1 to 20, such as methyl group, ethyl group, isopropyl group, n-hexyl group, 2-ethylhexyl group, 2-heptyl group, and vinyl group. Each of Y1 to Y4 includes an acidic group bindable to titanium oxide. Specific examples of such acidic groups are represented by the following formulae Y-1 to Y-5.

 Y-1

 Y-2

 Y-3

 Y-4

 Y-5

Specific examples of the photosensitizing compound represented by the formula (1) include, but are not limited to, the following exemplary compounds 1 to 17.

Exemplary Compound 1

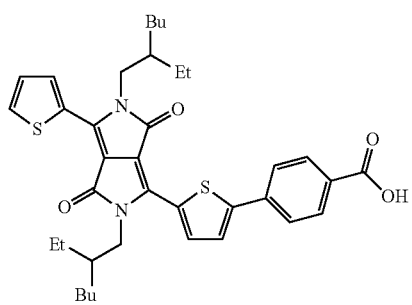

Exemplary Compound 2

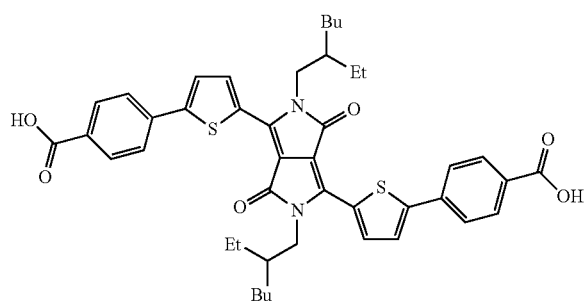

Exemplary Compound 3

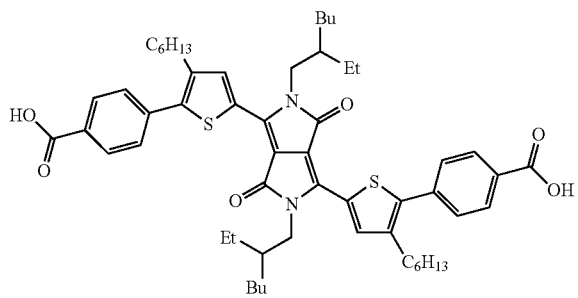

Exemplary Compound 4

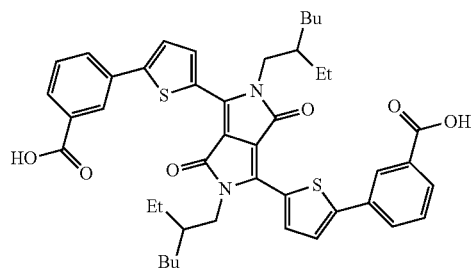

-continued
Exemplary Compound 5
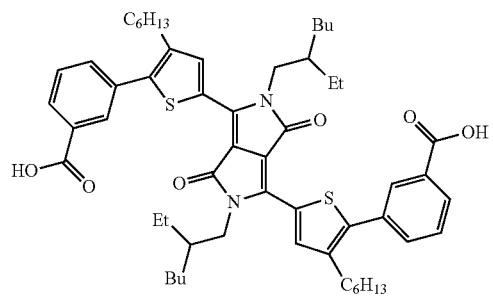
Exemplary Compound 6
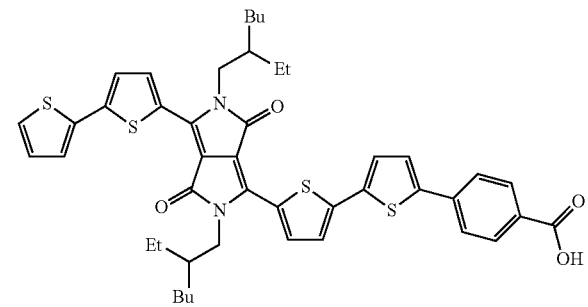
Exemplary Compound 7
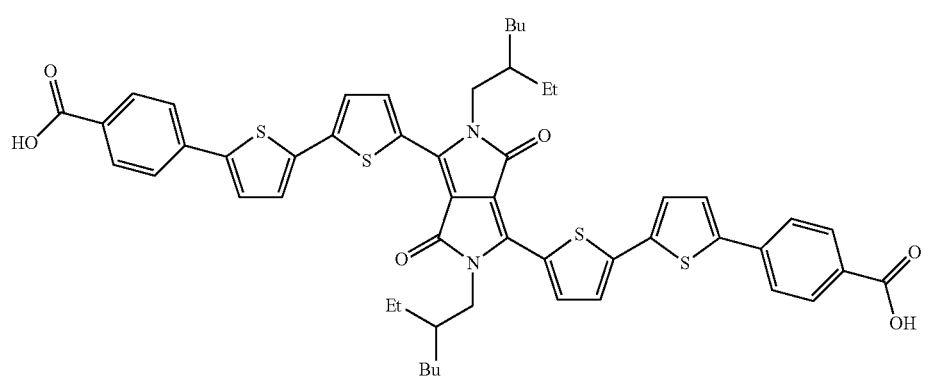
Exemplary Compound 8
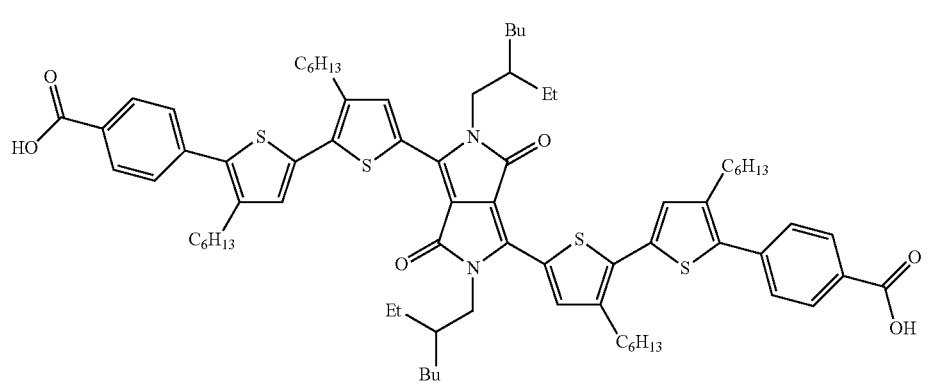
Exemplary Compound 9
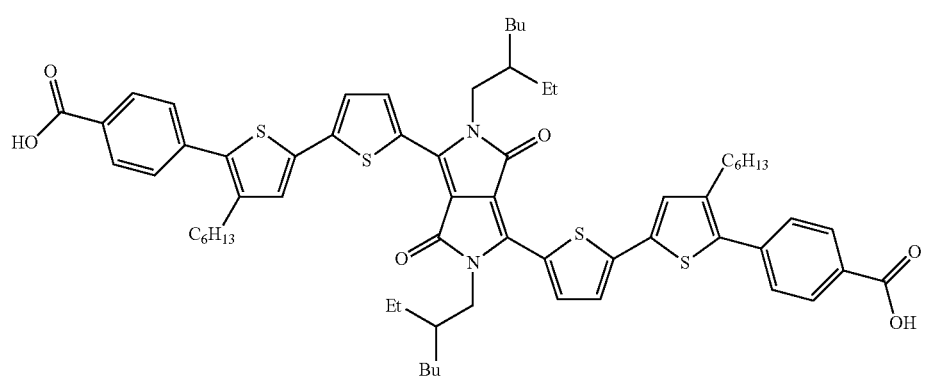

Exemplary Compound 10
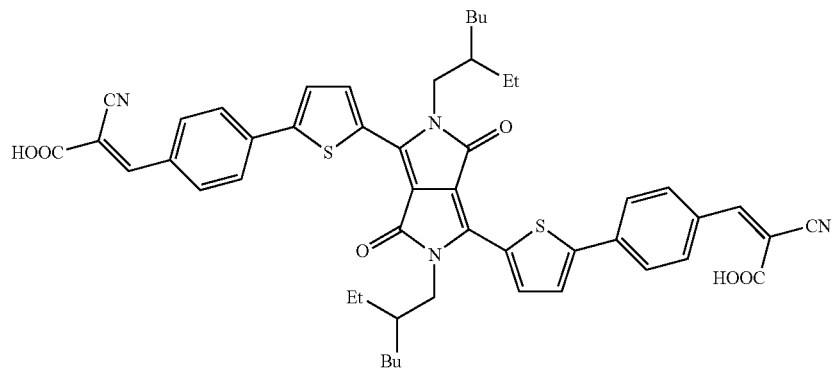
Exemplary Compound 11
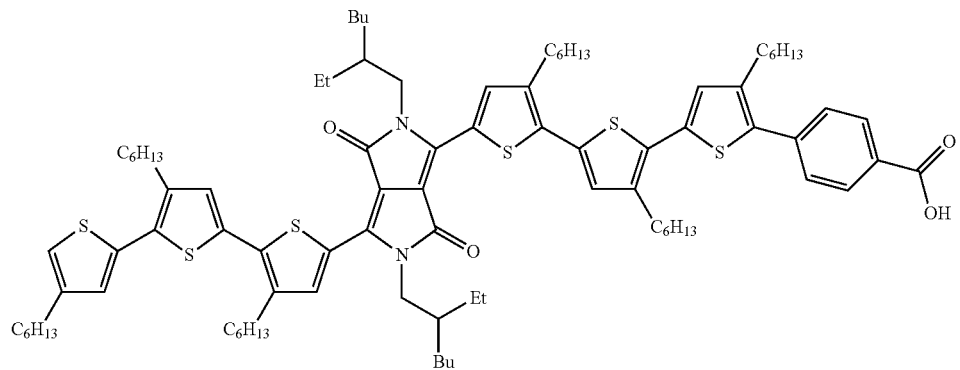
Exemplary Compound 12
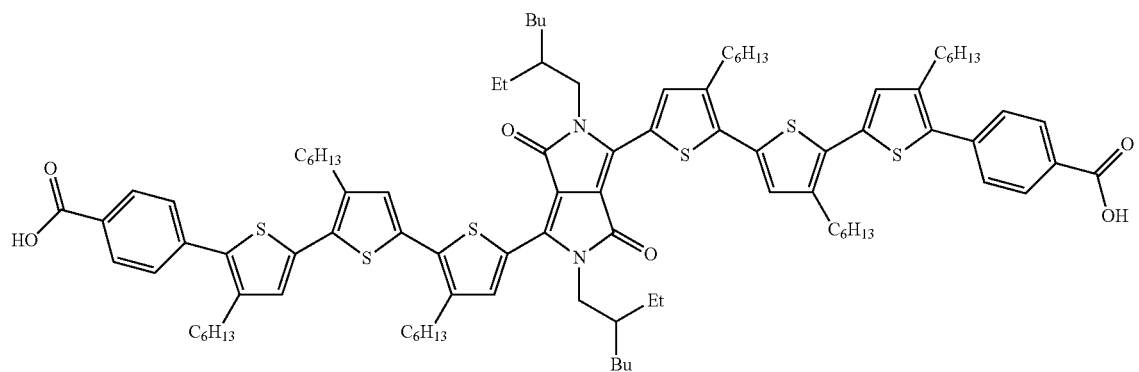
Exemplary Compound 13
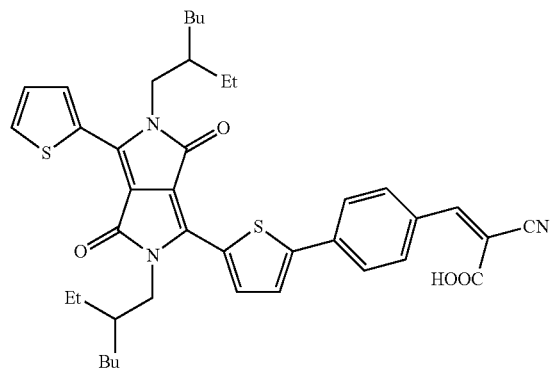
Exemplary Compound 14

Exemplary Compound 15

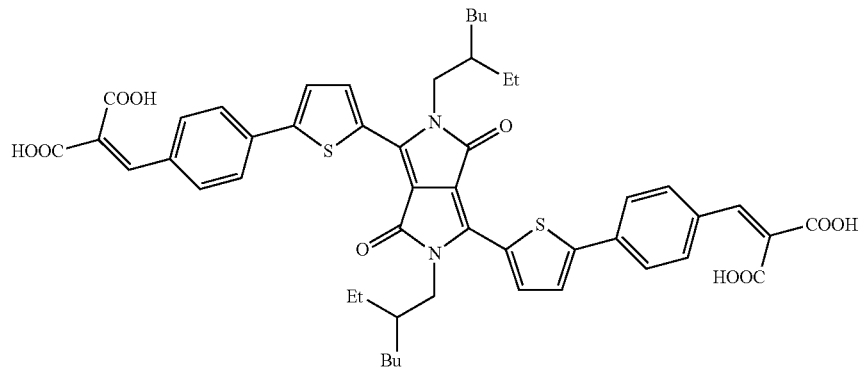

Exemplary Compound 16

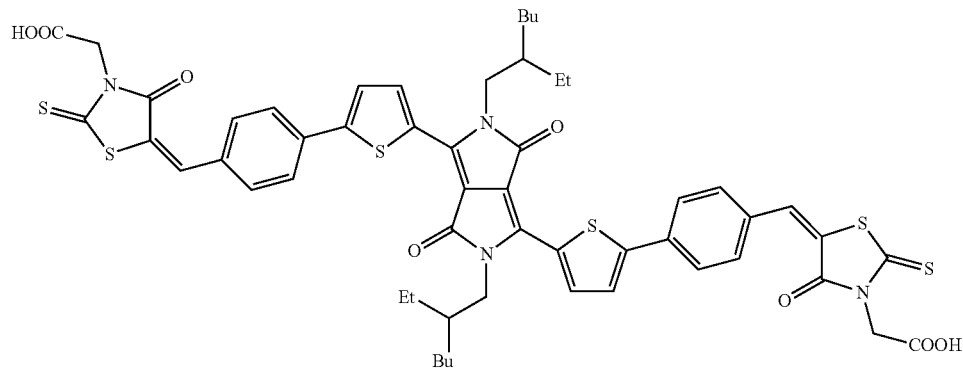

Exemplary Compound 17

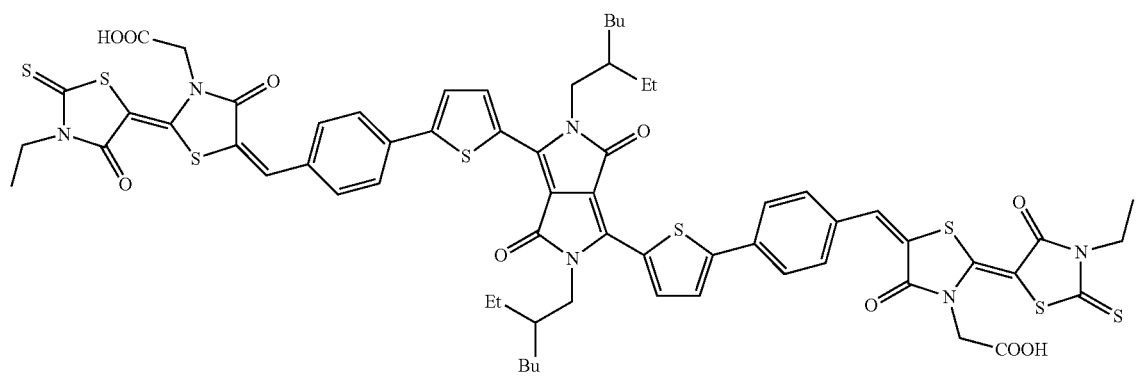

Each photosensitizing compound can be used alone and two or more photosensitizing compounds can be used in combination. Specific examples of photosensitizing compounds which can be used in combination include, but are not limited to, metal complex compounds described in JP-H07-500630-A, JP-H10-233238-A, JP-2000-26487-A, JP-2000-323191-A, JP-2001-59062-A, etc.; coumarin compounds described in JP-H10-93118-A, JP-2002-164089-A, JP-2004-95450-A, J. Phys. Chem. C, 7224, Vol. 111 (2007) etc.; polyene compounds described in JP-2004-95450-A, Chem. Commun., 4887 (2007), etc.; indoline compounds described in JP-2003-264010-A, JP-2004-63274-A, JP-2004-115636-A, JP-2004-200068-A, JP-2004-235052-A, J. Am. Chem. Soc., 12218, Vol. 126 (2004), Chem. Commun., 3036 (2003), Angew. Chem. Int. Ed., 1923, Vol. 47 (2008), etc.; thiophene compounds described in J. Am. Chem. Soc., 16701, Vol. 128 (2006), J. Am. Chem. Soc., 14256, Vol. 128 (2006), etc.; cyanine dyes described in JP-H11-86916-A, JP-H11-214730-A, JP-2000-106224-A, JP-2001-76773-A, JP-2003-7359-A, etc.; merocyanine dyes described in JP-H11-214731-A, JP-H11-238905-A, JP-2001-52766-A, JP-2001-76775-A, JP-2003-7360-A, etc.; 9-aryl xanthene compounds described in JP-H10-92477-A, JP-H11-273754-A, JP-H11-273755-A, JP-2003-31273-A, etc.; triarylmethane compounds described in JP-H10-93118-A, JP-2003-31273-A, etc.; and phthalocyanine and porphyrin compounds described in JP-H09-199744-A, JP-H10-233238-A, JP-H11-204821-A, JP-H11-265738-A, J. Phys. Chem., 2342, Vol. 91 (1987), J. Phys. Chem. B, 6272, Vol. 97 (1993), Electroanal. Chem., 31, Vol. 537 (2002), JP-2006-032260-A, J. Porphyrins Phthalocyanines, 230, Vol. 3 (1999), Angew. Chem. Int. Ed., 373, Vol. 46 (2007), Langmuir, 5436, Vol. 24 (2008), etc.

The photosensitizing compound 4 can be adsorbed to the electron transport layer 3 by a method in which an electron collecting electrode including a semiconductor particle is dipped in a solution or dispersion of a photosensitizing compound, or a method in which a solution or dispersion of a photosensitizing compound is applied to the electron transport layer 3.

In the former case, immersion method, dip method, roller method, air knife method, etc., can be employed. In the latter case, wire bar method, slide hopper method, extrusion method, curtain method, spin method, spray method, etc., can be employed.

Alternatively, the adsorption can be performed in a supercritical fluid of carbon dioxide etc.

At the adsorption of the photosensitizing compound, a condensation agent can be used in combination.

The condensation agent may act as a catalyst for physically or chemically binding the photosensitizing compound and electron transportable compound to a surface of an inorganic material, or may stoichiometrically act for advantageously transfer chemical equilibrium. Further, a condensation auxiliary agent, such as a thiol and a hydroxy compound, may be used in combination.

Specific examples of solvents for dissolving or dispersing the photosensitizing compound include, but are not limited to, water; alcohol solvents such as methanol, ethanol, and isopropyl alcohol; ketone solvents such as acetone, methyl ethyl ketone, and methyl isobutyl ketone; ester solvents such as ethyl formate, ethyl acetate, and n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These solvents can be used alone or in combination.

Some photosensitizing compounds more effectively work if aggregation between the compounds is suppressed. Therefore, a co-adsorption agent (an aggregation dissociating agent) can be used in combination.

Specific preferred examples of the co-adsorption agent include, but are not limited to, steroid compounds such as cholic acid and chenodeoxycholic acid; long-chain alkylcarboxylic acids; and long-chain alkylsulfonic acids. The addition amount of the aggregation dissociating agent is preferably from 0.01 to 500 parts by weight, more preferably from 0.1 to 100 parts by weight, based on 1 part of the dye.

The temperature at the adsorption of the photosensitizing compound alone or a combination of the photosensitizing compound and co-adsorption agent is preferably from −50 to 200° C.

The adsorption may be performed under either static condition or agitation.

The agitation may be performed by means of stirrer, ball mill, paint conditioner, sand mill, attritor, disperser, ultrasonic disperser, etc.

The time required for the adsorption is preferably from 5 seconds to 1,000 hours, more preferably from 10 seconds to 500 hours, and most preferably from 1 minute to 150 hours.

Preferably, the adsorption is performed in dark place.

Charge Transfer Layer

Specific examples of usable materials for the charge transfer layer 5 include, but are not limited to, an electrolytic solution in which a redox pair is dissolved in an organic solvent, a gel electrolyte in which an organic solvent solution of a redox pair is impregnated in a polymer matrix, a molten salt including a redox pair, a solid electrolyte, an inorganic hole transport material, and an organic hole transport material.

Preferably, the electrolytic solution consists of an electrolyte, a solvent, and an additive. Specific preferred examples of the electrolyte include, but are not limited to, combinations of metal iodide, such as lithium iodide, sodium iodide, potassium iodide, cesium iodide, and calcium iodide, with iodine; combinations of iodine salts of quaternary ammonium compounds, such as tetraalkylammonium iodide, pyridinium iodide, and imidazolium iodide, with iodine; combinations of metal bromides, such as lithium bromide, sodium bromide, potassium bromide, cesium bromide, and calcium bromide, with bromine; combinations of bromine salts of quaternary ammonium compounds, such as tetraalkylammonium bromide and pyridinium bromide, with bromide; metal complexes such as ferrocyanic acid salt-ferricyanic acid salt, and ferrocene-ferricinium ion; sulfur compounds such as sodium polysulfide and alkyl thiol-alkyl disulfide; viologen dye; metal complexes of hydroquinone-quinone and cobalt; and nitroxide radical compounds.

These electrolytes can be used alone or in combination. Ionic liquids, such as imidazolinium iodide, do not have to include a solvent.

The electrolyte content in the electrolytic solution is preferably from 0.05 to 20 M and more preferably from 0.1 to 15 M. Specific preferred examples of the solvents for the electrolytic solution include, but are not limited to, carbonate solvents such as ethylene carbonate and propylene carbonate; heterocyclic compounds such as 3-methyl-2-oxazolidinone; ether solvents such as dioxane, diethyl ether, and ethylene glycol dialkyl ether; alcohol solvents such as methanol, ethanol, and propylene glycol monoalkyl ether; nitrile solvents such as acetonitrile and benzonitrile; and aprotic polar solvents such as dimethylsulfoxide and sulfolane. These solvents may be used in combination with basic compounds such as t-butyl pyridine, 2-picoline, and 2,6-lutidine.

The electrolyte may gelate by means of addition of polymer, addition of oil gelator, polymerization with polyfunctional monomers, cross-linking reaction of polymer, etc. When the addition of polymer is employed, specific preferred examples of the polymer include polyacrylonitrile and polyvinylidene fluoride. When the addition of oil gelator is employed, specific preferred examples of the gelator include, but are not limited to, dibenzylidene-D-sorbitol, cholesterol derivatives, amino acid derivatives, alkylamide derivatives of trans-(1R,2R)-1,2-cyclohexanediamine, alkyl urea derivatives, N-octyl-D-gluconamide benzoate, double-headed amino acid derivatives, and quaternary ammonium derivatives.

When the polymerization with polyfunctional monomers is employed, specific preferred examples of the monomers include, but are not limited to, divinylbenzene, ethylene glycol dimethacrylate, ethylene glycol diacrylate, diethylene glycol dimethacrylate, triethylene glycol dimethacrylate, pentaerythritol triacrylate, and trimethylolpropane triacrylate. The following monofunctional monomers may be used in combination: esters and amides derived from acrylic acids and α-alkyl acrylic acids, such as acrylamide and methyl acrylate; esters derived from maleic acid and fumaric acid, such as dimethyl maleate and diethyl fumarase; dienes such as butadiene and cyclopentadiene; aromatic vinyl compounds such as styrene, p-chlorostyrene, and sodium styrenesulfonate; vinyl esters; acrylonitrile; methacrylonitrile; vinyl compounds having nitrogen-containing heterocyclic ring; vinyl compounds having quaternary ammonium salts; N-vinyl formamide; vinyl sulfonic acid; vinylidene fluoride; vinyl alkyl ethers; and N-phenyl maleimide.

The ratio of the polyfunctional monomer to all the monomers is preferably from 0.5 to 70% by weight and more preferably from 1.0 to 50% by weight.

The above-described monomers are radical-polymerizable. Monomers for gel electrolytes are radical-polymerizable by means of heat, light, electron beam, or electrochemically. In a case in which a cross-linked polymer is formed by heat, specific preferred examples of usable polymerization initiators include, but are not limited to, azo initiators such as 2,2'-azobis isobutyronitrile, 2,2'-azobis(2,4-dimethyl valeronitrile), and dimethyl-2,2'-azobis(2-methyl propionate); and peroxide initiators such as benzoyl peroxide. The addition amount of the polymerization initiator is preferably from 0.01 to 20% by weight, more preferably from 0.1 to 10% by weight, based on total weight of the monomers.

When the electrolyte is allowed to gelate by means of cross-linking reaction of polymer, preferably, a polymer having a reactive group capable of cross-linking and a cross-linking agent are used in combination. Specific preferred examples of the reactive group capable of cross-linking include, but are not limited to, nitrogen-containing heterocyclic ring such as pyridine, imidazole, thiazole, oxazole, triazole, morpholine, piperidine, and piperazine. Specific preferred examples of the cross-linking agent include, but are not limited to, difunctional or more functional reagents electrophilically reactive to nitrogen atoms in alkyl halide, aralkyl halide, sulfonate, acid anhydride, acid chloride, and isocyanate.

Inorganic Hole Transport Layer

When an inorganic solid compound is used in place of the electrolyte, copper iodide, copper thiocyanate, etc., may be introduced into the inside of the electrode by means of cast method, application method, spin coat method, immersion method, electrolytic plating, etc.

Organic Hole Transport Layer

An organic hole transport material can be used in place of the electrolyte. An organic hole transport layer may have either a monolayer structure consisting of a single material or a multilayer structure including multiple materials. When the multilayer structure is employed, it is preferable that an organic hole transport layer adjacent to the second electrode 6 includes a polymeric material. Having high film-forming performance, the polymeric material can smoothen the surface of the porous electron transport layer, improving photoelectric conversion property. In addition, having difficulty in penetrating into the porous electron transport layer, the polymeric material can cover the surface of the porous electron transport layer well, preventing the occurrence of short circuit with providing high performance.

Specific examples of the organic hole transport material used alone for the monolayer structure include, but are not limited to, oxadiazole compounds described in JP-S34-5466-A, etc.; triphenylmethane compounds described in JP-S45-555-A, etc.; pyrazoline compounds described in JP-S52-4188-A, etc.; hydrazone compounds described in JP-S55-42380-A, etc.; oxadiazole compounds described in JP-S56-123544-A, etc.; tetraaryl benzidine compounds described in JP-S54-58445-A, etc.; and stilbene compounds described in JP-S58-65440-A, JP-S60-98437-A, etc.

Specific examples of the polymeric material usable for the organic hole transport layer adjacent to the second electrode 6 include, but are not limited to, the following hole transportable polymeric materials: polythiophene compounds such as poly(3-n-hexylthiophene), poly(3-n-octyloxythiophene), poly(9,9'-dioctyl-fluorene-co-bithiophene), poly(3,3'''-di-dodecyl-quarter-thiophene), poly(3,6-dioctylthieno[3,2-b]thiophene), poly(2,5-bis(3-decylthiophene-2-yl)thieno[3,2-b]thiophene), poly(3,4-didecylthiophene-co-thieno-[3,2-b]thiophene), poly(3,6-dioetylthieno[3,2-b]thiophene-co-thieno[3,2-b]thiophene), poly(3,6-dioctylthieno[3,2-b]thiophene-co-thiophene), and poly(3,6-dioetylthieno[3,2-b]thiophene-co-bithiophene); polyphenylenevinylene compounds such as poly[2-methoxy-5-(2-ethylhexyloxy)-1,4-phenylenevinylene], poly[2-methoxy-5-(3,7-dimethyloctyloxy)-1,4-phenylenevinylene], and poly[2-methoxy-5-(2-ethylphenyloxy)-1,4-phenylenevinylene)-co-(4,4'-biphenylene-vinylene); polyfluorene compounds such as poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene]), poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)], polyphenylene compounds such as poly[2,5-dioctyloxy-1,4-phenylene] and poly[2,5-di(2-ethylhexyloxy-1,4-phenylene]; polyarylamine compounds such as poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly [(N,N'-bis(4-octyloxyphenyl)benzidine-N,N'-(1,4-diphenylene)], poly[N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene]; and polythiadiazole compounds such as poly [(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole). Among these materials, polythiophene compounds and polyarylamine compounds are preferable in terms of carrier mobility and ionization potential.

An additive may be further added to the organic hole transport material.

Specific preferred examples of the additive include, but are not limited to, iodine; metal iodides such as lithium iodide, sodium iodide, potassium iodide, cesium iodide, calcium iodide, copper iodide, iron iodide, and silver iodide; iodine salts of quaternary ammonium compounds such as tetraalkylammonium iodide and pyridinium iodide; metal bromides such as lithium bromide, sodium bromide, potassium bromide, cesium bromide, and calcium bromide; bromine salts of quaternary ammonium compounds such as tetraalkylammonium bromide and pyridinium bromide; metal chlorides such as copper chloride and silver chloride; metal salts of acetic acids such as copper acetate, silver acetate, and palladium acetate; metals salts of sulfuric acids such as copper sulfate and zinc sulfate; metal complexes such as ferrocyanic acid salt-ferricyanic acid salt, and ferrocene-ferricinium ion; sulfur compounds such as sodium polysulfide and alkyl thiol-alkyl disulfide; viologen dye; hydroquinones; ion liquids described in Inorg. Chem. 35 (1996) 1168 such as 1,2-dimethyl-3-n-propyl imidazolinium iodide, 1-methyl-3-n-hexyl imidazolinium iodide, 1,2-dimethyl-3-ethyl imidazolium trifluoromethane sulfonate, 1-methyl-3-butyl imidazolium nonafluorobutyl sulfonate, and 1-methyl-3-ethyl imidazolium bis (trifluoromethyl) sulfonylimide; basic compounds such as pyridine, 4-t-butyl pyridine, and benzimidazole; and lithium compounds such as lithium trifluoromethane sulfonylimide and lithium diisopropylimide.

For the purpose of improving conductivity, an oxidant may be added for converting a part of the organic hole transport materials into radical cations. Specific examples of the oxidant include, but are not limited to, tris(4-bromophenyl)aminium hexachloroantimonate, silver hexafluoroantimonate, nitrosonium tetrafluoroborate, and silver nitrate. Not all the organic hole transport material need to be oxidized by the oxidant and only a part of them may be oxidized. The oxidant having been added to the system may be either taken out or kept therein.

The organic hole transport layer is directly formed on the electron transport layer 3 that is carrying the photosensitizing compound. The organic hole transport layer is not limited in production method and can be produced by, for example, methods of forming thin layer in vacuum, such as vacuum deposition, and wet film-forming methods. In view of production cost, wet film-forming methods are preferable. Specifically, a method of applying on the electron transport layer is preferable.

This wet film-forming method is not limited in application method. Specific examples of the application method include, but are not limited to, dip method, spray method, wire bar method, spin coat method, roller coat method, blade coat method, gravure coat method, and wet printing methods such as relief, offset, gravure, intaglio, rubber plate, and screen printings. The layer may be formed in a supercritical fluid or a subcritical fluid.

The supercritical fluid is not limited in substance so long as it exists as a non-cohesive high-density fluid at temperatures and pressures beyond the region where gases and liquids can coexist (i.e., the critical point), without cohering even under compression, while having a temperature equal to or above the critical temperature and a pressure equal to or above the critical pressure. Specifically, those having a low critical temperature are preferable.

Specific examples of the supercritical fluid include, but are not limited to, carbon monoxide, carbon dioxide, ammonia, nitrogen, water, alcohol solvents such as methanol, ethanol, and n-butanol, hydrocarbon solvents such as ethane, propane, 2,3-dimethylbutane, benzene, and toluene, halogen solvents such as methylene chloride and chlorotrifluoromethane, and ether solvents such as dimethyl ether. Among these substances, carbon dioxide, the supercritical pressure and temperature of which are 7.3 MPa and 31° C., respectively, is preferable because carbon dioxide is easy to put into a supercritical state and easy to handle because of its non-combustibility.

These fluids can be used alone or in combination.

The subcritical fluid is not limited in substance so long as it exists as a high-pressure liquid at temperatures and pressures near the critical point.

The above-described substances preferable for the supercritical fluid are also preferable fir the subcritical fluid.

The supercritical fluid is not limited in critical temperature and pressure but preferably has a critical temperature of from −273 to 300° C., more preferably from 0 to 200° C.

In addition, an organic solvent and/or entrainer can be used in combination with the supercritical fluid or subcritical fluid.

Addition of an organic solvent and/or entrainer facilitates adjustment of solubility in the supercritical fluid.

Specific examples of the organic solvent include, but are not limited to, ketone solvents such as acetone, methyl ethyl ketone, and methyl isobutyl ketone; ester solvents such as ethyl formate, ethyl acetate, and n-butyl acetate; ether solvents such as diisopropyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

After the organic hole transport material is provided on the first electrode having been provided with the electron transport material covered with the photosensitizing compound, press treatment may be conducted. The press treatment brings the organic hole transport material into intimate contact with the porous electrode to improve efficiency. The press treatment may be a press molding method using a flat plate such as IR tablet pelletizer or a roll press method using a roller. The pressure is preferably 10 kgf/cm$^2$ or more and more preferably 30 kgf/cm$^2$ or more. The pressing time is preferably within 1 hour. Heat can be applied during the press treatment, if necessary. It is possible to sandwich a release material between the presser and the electrode in the press treatment. Specific examples of the release material include, but are not limited to, fluorine resins such as polytetrafluoroethylene, polychlorotrifluoroethylene, tetrafluoroethylene-hexafluoropropylene copolymer, perfluoroalkoxyfluoro resin, polyvinylidene fluoride, ethylene-tetrafluoroethylene copolymer, ethylene-chlorotrifluoroethylene copolymer, and polyvinyl fluoride.

After the press treatment and before provision of an opposite electrode, a metal oxide may be provided to between the organic hole transport material and the second material. Specific examples of the metal oxide include, but are not limited to, molybdenum oxide, tungsten oxide, vanadium oxide, and nickel oxide. Among these materials, molybdenum oxide is preferable.

There is no limit on how to provide metal oxide on the organic hole transport material. For example, methods of forming thin layer in vacuum, such as sputtering and vacuum deposition, and net film-forming methods can be employed.

Specifically, a wet film-forming method including preparing a paste in which powder or sol of metal oxide is dispersed and applying the paste to the hole transport layer is preferable.

This wet film-forming method is not limited in application method.

Specific examples of the application method include, but are not limited to, dip method, spray method, wire bar method, spin coat method, roller coat method, blade coat method, gravure coat method, and net printing methods such as relief, offset, gravure, intaglio, rubber plate, and screen printings. The film thickness is preferably from 0.1 to 50 nm and more preferably from 1 to 10 nm.

Second Electrode

Methods of forming the charge transfer layer are of two types.

In one method, an opposite electrode is attached to a layer containing semiconductor particles carrying a sensitizing dye and then a charge transfer layer in the form of liquid is sandwiched therebetween. In the other method, a charge transfer layer is directly provided on a layer containing semiconductor particles.

In the latter method, an opposite electrode is provided thereafter.

In the former method, the process of sandwiching the charge transfer layer may be a normal pressure process which uses capillary phenomenon such as immersion, or a vacuum process in which a gas phase is substituted with a liquid phase under reduced pressures. In the latter method, if the charge transfer layer is wet, the opposite electrode should be provided while the wet charge transfer layer is kept undried so that a preventive measure for liquid leakage can be prepared at the edge portion. If the charge transfer layer is in the form of a gel electrolyte, the gel electrolyte may be applied under wet condition and then solidified by means of polymerization, etc. In this case, the opposite electrode may be provided after the charge transfer layer is dried and solidified. Specific examples of methods for providing electrolytic solution, organic hole transport material solution, or gel electrolyte include, but are not limited to, immersion method, roller method, dip method, air knife method, extrusion method, slide hopper method, wire bar method, spin method, spray method, cast methods, and various printing methods, which are similar to those for providing semiconductor-particle-containing layer or dye.

The opposite electrode may include a support medium having a conductive layer. However, the support medium is not necessary when the opposite electrode has a configuration such that the strength and sealing performance are kept sufficient. Specific examples of usable material for the opposite electrode include, but are not limited to, metals such as platinum, gold, silver, copper, aluminum, rhodium, and indium; and conductive metal oxides such as carbon, ITO, and FTO.

The opposite electrode is not limited in thickness.

In a case in which the charge transfer layer includes an inorganic hole transport material an organic hole transport material, a hole collecting electrode is provided on the solid hole transport layer or the above-described metal oxide. The hole collecting electrode may have a similar configuration to the electron collecting electrode. However, the support medium is not necessary when the hole collecting electrode has a configuration such that the strength and sealing performance are kept sufficient. Specific examples of usable material for the hole collecting electrode include, but are not limited to, metals such as platinum, gold, silver, copper, and aluminum; carbon compounds such as graphite, fullerene, and carbon nanotube; conductive metal oxides such as ITO and FTO; and conductive polymers such as polythiophene and polyaniline.

The hole collecting electrode is not limited in thickness. The above-described materials can be used alone or in combination. The hole collecting electrode can be formed on the hole transport layer by means of application, lamination, vapor deposition, CVD, bonding, etc., depending on the kind of material used.

To act as a photoelectric conversion element, at least one of the electron collecting electrode and hole collecting electrode is substantively transparent.

According to an embodiment, it is preferable that the electron collecting electrode is made transparent to incoming solar light. In this case, the hole collecting electrode is preferably made of light reflective materials such as metal-deposited or conductive-oxide-deposited glass or plastic, or metallic thin film.

It is also effective to provide an antireflective layer on the solar light incoming side.

The photoelectric conversion element according to an embodiment of the present invention is applicable to solar cells and power-supply devices using solar cells.

For example, the photoelectric conversion element can be applied to solar cells used in electronic desk calculators and wristwatches, and especially to power-supply devices used in cell phones, electronic organizers, electronic papers, etc., taking advantage of the dye-sensitized solar cells according to an embodiment of the invention. In addition, the photoelectric conversion element can also be used as an auxiliary power supply for lengthening continuous operating time of charging-type or battery type electronic devices.

EXAMPLES

Having generally described this invention, further understanding can be obtained by reference to certain specific examples which are provided herein for the purpose of illustration only and are not intended to be limiting.

Synthesis of Photosensitizing Compounds

Synthesis of Exemplary Compound 1

First, 0.30 g of a diketopyrrolopyrrole compound represented by the following formula (a), 0.16 g of 4-bromobenzoic acid, 0.05 g of palladium acetate, 0.2 g of potassium carbonate, and 10 ml of dimethylacetamide are agitated at 100° C. under nitrogen gas flow.

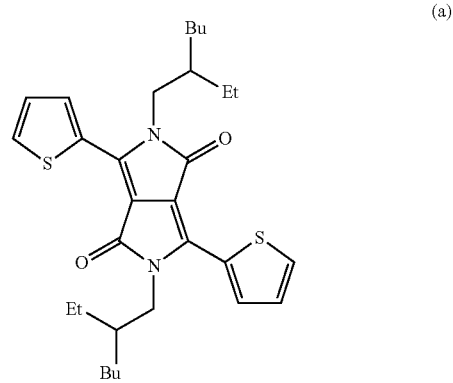

(a)

Figure 2:
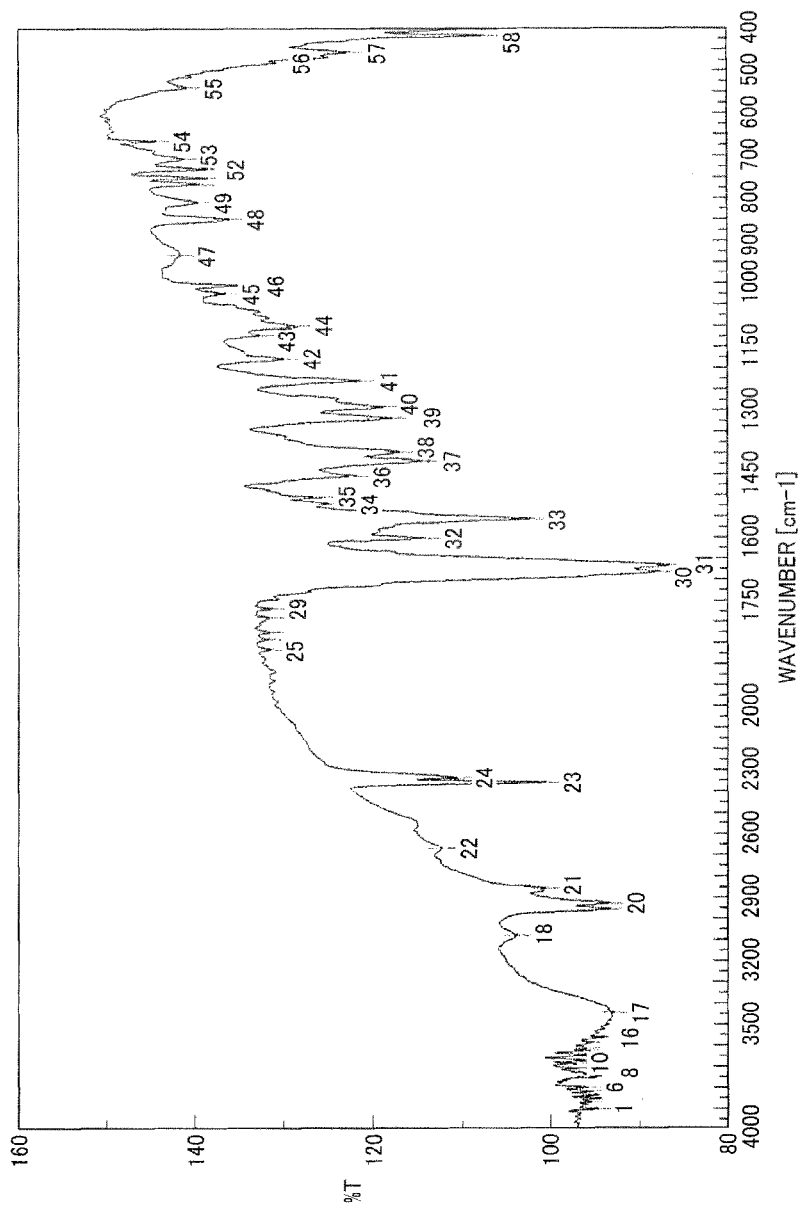
FIG. 2 is an IR spectrum of Exemplary Compound 1.

Four hours later, the reaction liquid is poured into methanol and the precipitation product is collected by filtration. The collected precipitation product is purified by silica gel column chromatography using a mixed eluent of THF/toluene at a mixing ratio of 8/2, and is further purified by recrystallization. Thus, Exemplary Compound 1, which is a red-purple solid, in an amount of 0.25 g is obtained. The IR spectrum thereof is shown in FIG. 2.

Synthesis of Exemplary Compound 2

Figure 3:
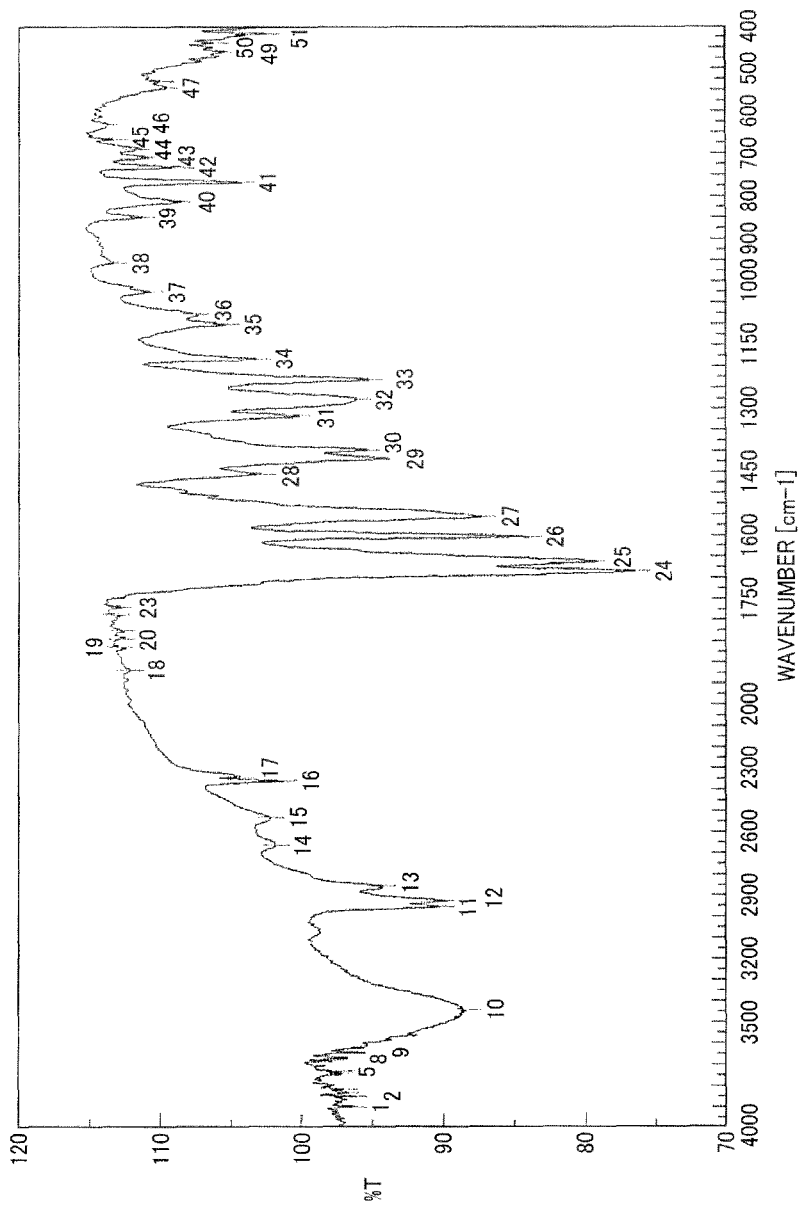
FIG. 3 is an IR spectrum of Exemplary Compound 2.

The procedure for preparing Exemplary Compound 1 is repeated except for changing the used amount of 4-bromobenzoic acid to 0.32 g. Thus, Exemplary Compound 2, which is a purple solid, in an amount of 0.31 g is obtained. The IR spectrum thereof is shown in FIG. 3.

Synthesis of Exemplary Compound 3

First, 20 g of 4-hexyl-2-cyanothiophene, 21 g of diisopropyl succinate, 40 g of t-butoxy potassium, and 160 ml of t-amyl alcohol are agitated at 100° C. for 5 hours. The reaction liquid is cooled to 70° C. and 10 ml of acetic acid is added thereto. The precipitation product is collected by filtration and washed with methanol. Thus, a compound represented by the following formula (b) in an amount of 20 g is obtained.

(b)

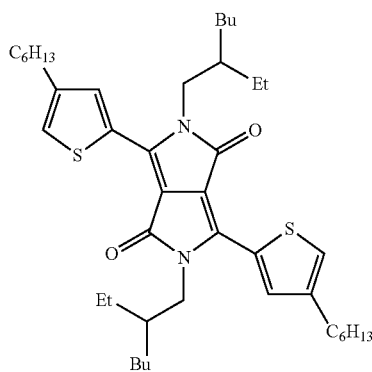

Figure 4:
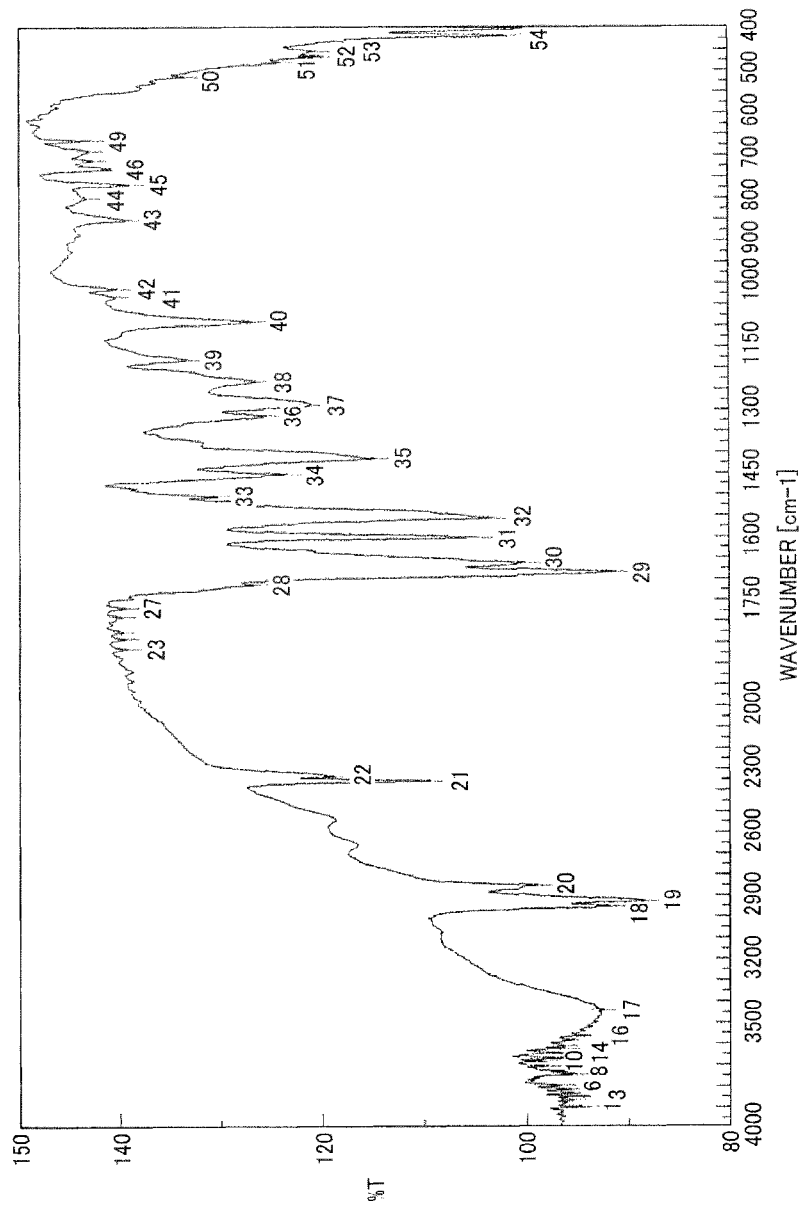
FIG. 4 is an IR spectrum of Exemplary Compound 3.

The procedure for preparing Exemplary Compound 2 is repeated except for replacing the compound represented by formula (a) with the compound represented by the formula (h) in an amount of 0.45 g. Thus, Exemplary Compound 3, which is a purple solid, in an amount of 0.35 g is obtained. The IR spectrum thereof is shown in FIG. 4.

Synthesis of Exemplary Compound 8

First, 10 g of the compound represented by the formula (b), 5.4 g of NBS, and 500 ml of chloroform are agitated at room temperature for 4 hours in light shielding condition. After solvent removal under reduced pressures and washing with methanol, a compound represented by the following formula (f) in an amount of 14 g is obtained.

(f)

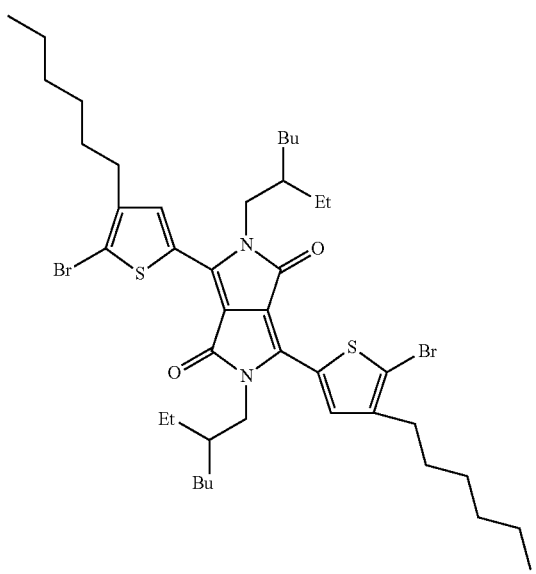

Next, 2.0 g of the compound represented by the formula (f), 1.5 g of 4-hexyl-2-thiophene boronic acid, 10 ml of 2M potassium phosphate aqueous solution, 30 ml of dioxane, and 150 mg of Pd(P-tBu$_3$)$_2$ are refluxed under argon gas flow for 4 hours. After being cooled to room temperature, the reaction liquid is poured into methanol to cause precipitation. The precipitation product is collected by filtration, washed with methanol, and purified by silica gel column chromatography using toluene as art eluent. Thus, a compound represented by the following formula (c) in an amount of 1.9 g is obtained.

(c)

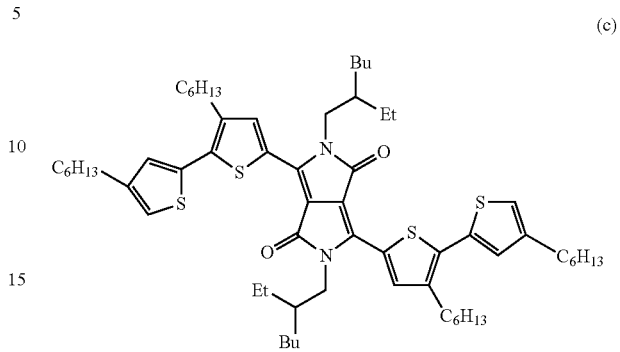

Figure 5:
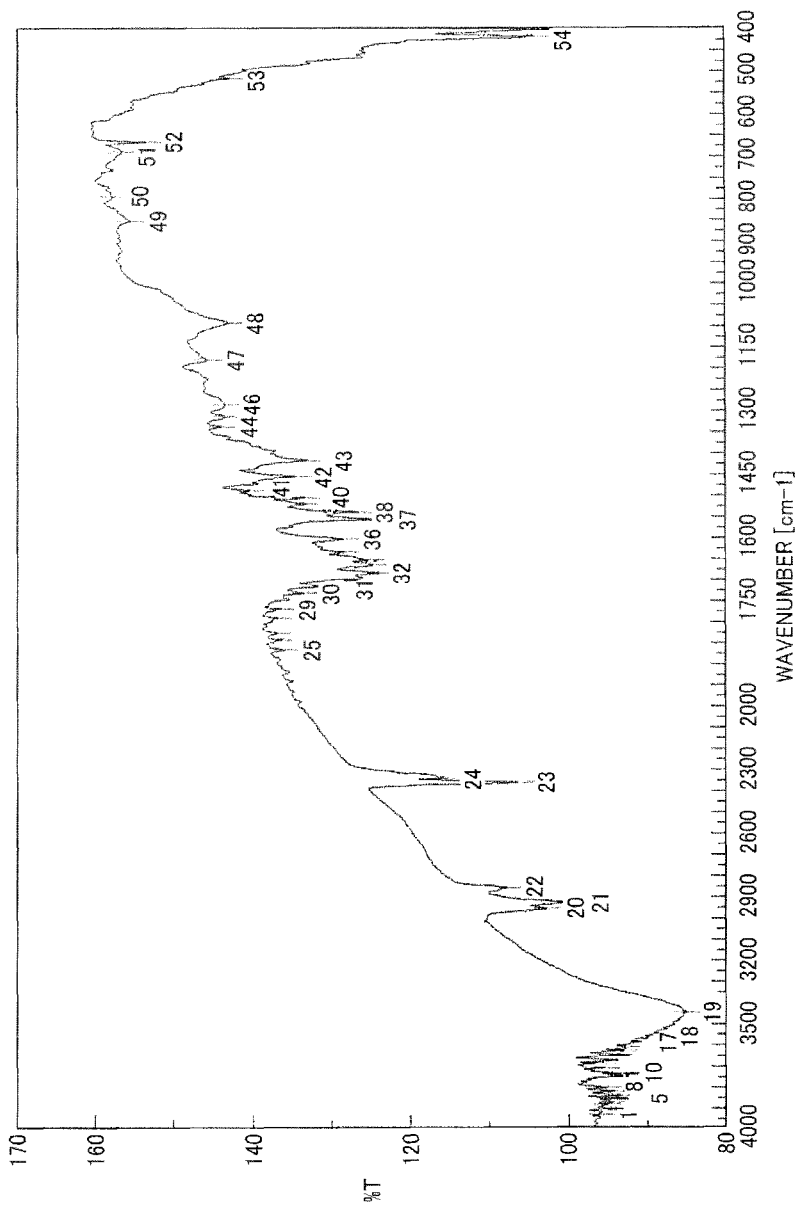
FIG. 5 is an IR spectrum of Exemplary Compound 8.

The procedure for preparing Exemplary Compound 3 is repeated except for replacing the compound represented by formula (b) with the compound represented by the formula (c) in an amount of 0.61 g. Thus, Exemplary Compound 8, which is a navy blue solid, in an amount of 0.29 g is obtained. The IR spectrum thereof is shown in FIG. 5.

Synthesis of Exemplary Compound 9

The procedure for preparing the compound represented by formula (c) is repeated except for replacing the compound represented by formula (b) with the compound represented by the formula (a) in an amount of 8.0 g. Thus, a compound represented by formula (d) in an amount of 1.4 g is obtained.

(d)

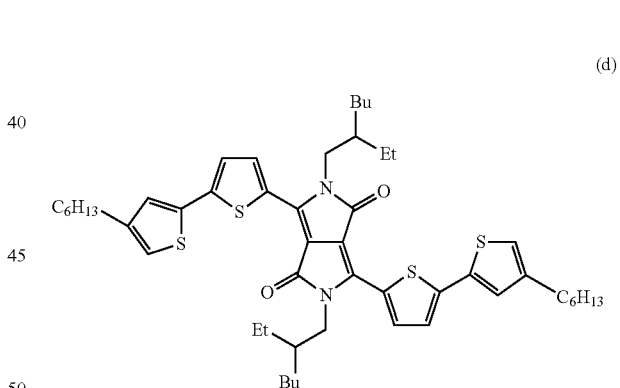

Figure 6:
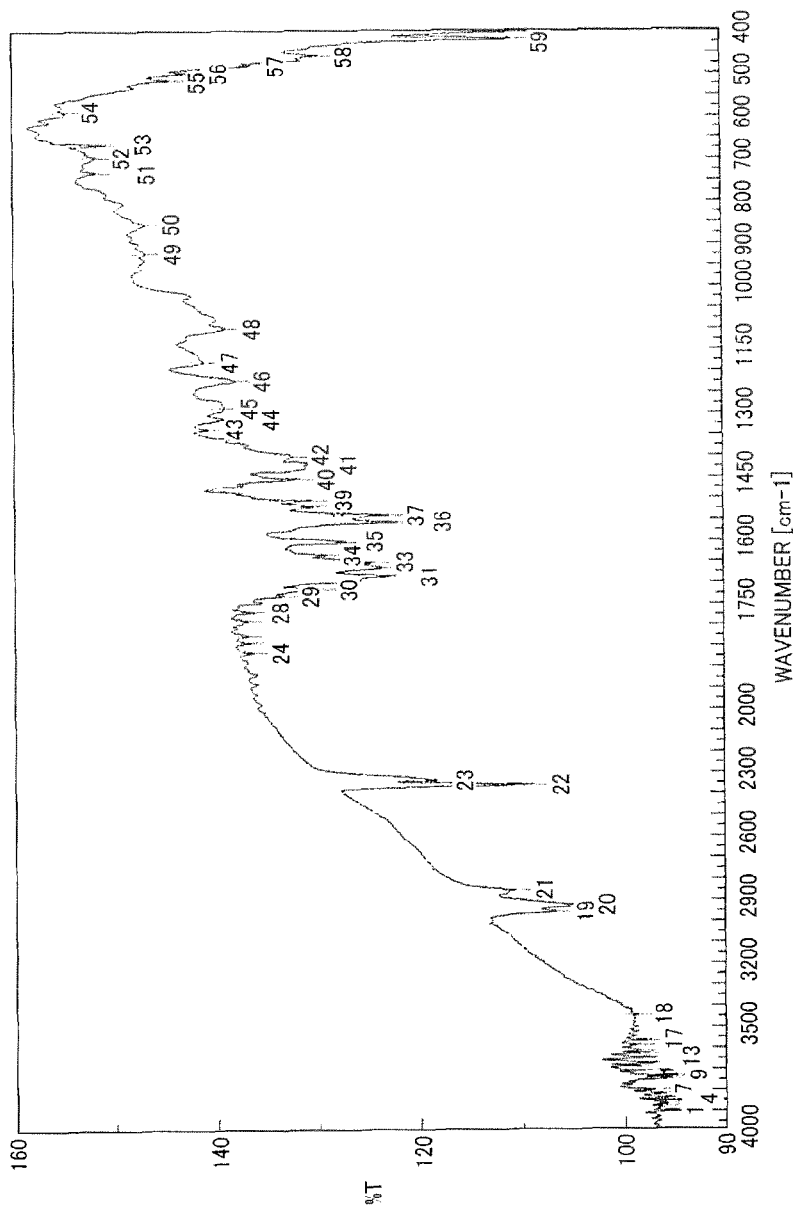
FIG. 6 is an IR spectrum of Exemplary Compound 9.

The procedure for preparing Exemplary Compound 3 is repeated except for replacing the compound represented by formula (b) with the compound represented by the formula (d) in an amount of 0.47 g. Thus, Exemplary Compound 9, which is a navy blue solid, in an amount of 0.29 g is obtained. The IR spectrum thereof is shown in FIG. 6.

Synthesis of Exemplary Compound 10

First, 0.30 g of a diketopyrrolopyrrole compound represented by the following formula (a), 0.16 g of 4-bromobenzaldehyde, 0.05 g of palladium acetate, 0.2 g of potassium carbonate, and 10 ml of dimethylacetamide are agitated at 100° C. under nitrogen gas flow.

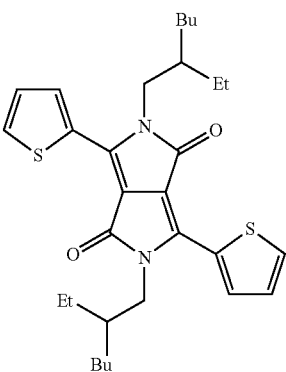

(a)

Four hours later, the reaction liquid is poured into methanol and the precipitation product is collected by filtration. The collected precipitation product is purified by silica gel column chromatography using a mixed eluent of THF/toluene at a mixing ratio of 8/2, and is further purified by recrystallization. Thus, a compound represented by the following formula (e) in an amount of 0.30 g is obtained.

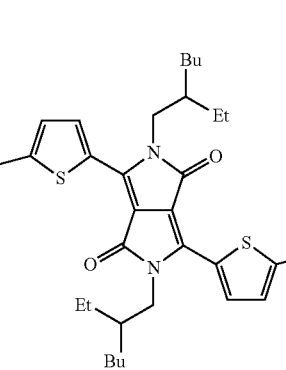

(e)

Next, 0.30 g of the compound represented by the formula (e) and 0.50 g of cyanoacetic acid are agitated in 10 ml of THF. Further, 1 ml of piperidine is added thereto and the mixture is refluxed for 3 hours. After being cooled to room temperature, the reaction liquid is poured into methanol to cause precipitation and the precipitation product is collected by filtration. The collected precipitation product is purified by silica gel column chromatography using a mixed eluent of THF/toluene at a mixing ratio of 8/2, and is further purified by recrystallization. Thus, Exemplary Compound 10, which is a red-purple solid, in an amount of 0.13 g is obtained.

Synthesis of Exemplary Compound 14

The procedure for preparing Exemplary Compound 10 is repeated except for replacing cyanoacetic acid with malonic acid in an amount of 0.48 g. Thus, Exemplary Compound 14 in an amount of 0.12 g is obtained.

Synthesis of Exemplary Compound 16

The procedure for preparing Exemplary Compound 10 is repeated except for replacing cyanoacetic acid with rhodanine-3-acetic acid in an amount of 0.65 g. Thus, Exemplary Compound 16 in an amount of 0.15 g is obtained.

Example 1

Preparation of Titanium Oxide Semiconductor Electrode

First, 2 ml of titanium tetra-n-propoxide, 4 ml of acetic acid, 1 ml of ion-exchange water, and 40 ml of 2-propanol are mixed. The mixture liquid is spin-coated on a FTO glass substrate, dried at room temperature, and burned in the air at 450° C. for 30 minutes. The same mixture liquid is reapplied on the above-obtained electrode by spin coating so as to have a thickness of 100 nm and then burned in the air at 450° C. for 30 minutes, thus forming a dense electron transport layer.

Next, 3 g of a titanium oxide (P-25 from Nippon Aerosil Co., Ltd.). 0.3 g of acetyl acetone, 5.5 g of water, and 1.2 g of ethanol are subjected to a bead mill treatment for 12 hours.

The resulting dispersion liquid is mixed with 0.3 g of a surfactant (polyoxyethylene octyl phenyl ether from Wako Pure Chemical Industries, Ltd.) and 1.2 g of a polyethylene glycol (#20,000) to prepare a paste.

The paste is applied on the dense electron transport layer so as to have a thickness of 2 μm and then burned in the air at 500° C. for 30 minutes, thus forming a porous electron transport layer.

Covering with Photosensitizing Compound

The titanium oxide semiconductor electrode prepared above is left in a 0.5 mM THF solution of the photosensitizing compound represented by Exemplary Compound 1 at room temperature for 15 hours in a dark place so that the photosensitizing compound is adsorbed.

Preparation and Evaluation of Photoelectric Conversion Element

An electrolytic solution is prepared by dissolving 0.05M of iodine, 0.1M of lithium iodide, 0.6M of 1,3-dimethyl-2-imidazolinium iodide, and 0.05M of t-butyl pyridine in a mixed liquid of acetonitrile/valeronitrile at a mixing ratio of 17/3. An opposite electrode is prepared by sputtering platinum on FTO. A spacer having a thickness of 30 μm is sandwiched between the electrodes and the electrolytic solution is injected therein, thus preparing a dye-sensitized photoelectric conversion element. The photoelectric conversion element is irradiated with pseudo solar light emitted from a solar simulator (AM 1.5, 100 mw/cm$^2$) from the working electrode side to evaluate its characteristics. As a result, the open voltage is 0.65 V, the short-circuit current density is 6.7 mA/cm$^2$, the form factor is 0.58, and the conversion efficiency is 2.53%, which are good values.

Example 2

The procedure in Example 1 is repeated except for replacing Exemplary Compound 1 with Exemplary Compound 2, thus preparing a photoelectric conversion element.

Example 3

The procedure in Example 1 is repeated except for replacing Exemplary Compound 1 with Exemplary Compound 3, thus preparing a photoelectric conversion element.

Example 4

The procedure in Example 1 is repeated except for replacing Exemplary Compound 1 with Exemplary Compound 4, thus preparing a photoelectric conversion element.

Example 5

The procedure in Example 1 is repeated except for replacing Exemplary Compound 1 with Exemplary Compound 6, thus preparing a photoelectric conversion element.

Example 6

The procedure in Example 1 is repeated except for replacing Exemplary Compound 1 with Exemplary Compound 8, thus preparing a photoelectric conversion element.

Example 7

The procedure in Example 1 is repeated except for replacing Exemplary Compound 1 with Exemplary Compound 9, thus preparing a photoelectric conversion element.

Example 8

The procedure in Example 1 is repeated except for replacing Exemplary Compound 1 with Exemplary Compound 10, thus preparing a photoelectric conversion element.

Example 9

The procedure in Example 1 is repeated except for replacing Exemplary Compound 1 with Exemplary Compound 14, thus preparing a photoelectric conversion element.

Example 10

The procedure in Example 1 is repeated except for replacing Exemplary Compound 1 with Exemplary Compound 16, thus preparing a photoelectric conversion element.

Example 11

The procedure in Example 3 is repeated except for replacing the 0.5 mM THF solution of Exemplary Compound 3 with a mixed THF solution of 0.5 mM of Exemplary Compound 3 and 1.0 mM of chenodeoxycholic acid, thus preparing and evaluating a photoelectric conversion element. As a result of the evaluation, the open voltage is 0.69 V, the short-circuit current density is 12.2 mA/cm$^2$, the form factor is 0.61, and the conversion efficiency is 5.13%, which are good values.

Example 12

The procedure in Example 11 is repeated except for replacing the mixed THF solution of 0.5 mM of Exemplary Compound 3 and 1.0 mM of chenodeoxycholic acid with a mixed THF solution of 0.5 mM of Exemplary Compound 16 and 1.0 mM of chenodeoxycholic acid, thus preparing and evaluating a photoelectric conversion element. As a result, the open voltage is 0.59 V, the short-circuit current density is 9.2 mA/cm$^2$, the form factor is 0.60, and the conversion efficiency is 3.26%, which are good values.

Comparative Example 1

The procedure in Example 1 is repeated except for replacing the 0.5 mM THF solution of Exemplary Compound 1 with a 0.5 mM chlorobenzene solution of Comparative Compound 1 having the following formula, thus preparing and evaluating a photoelectric conversion element.

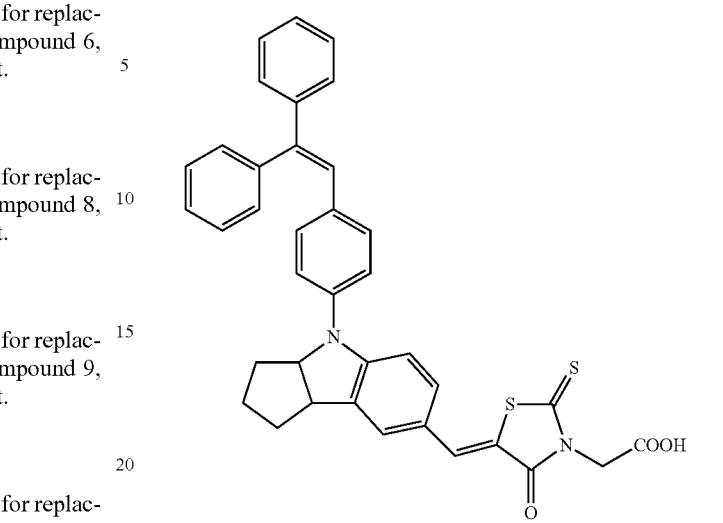

Comparative Compound 1

As a result, the open voltage is 0.60 V, the short-circuit current density is 4.1 in mA/cm$^2$, the form factor is 0.55, and the conversion efficiency is 1.35%. The conversion efficiency is lower than the photosensitizing compounds according to embodiments of the invention.

Comparative Example 2

The procedure in Example 1 is repeated except for replacing the 0.5 mM THF solution of Exemplary Compound 1 with a 0.5 mM ethanol solution of Comparative Compound 2 having the following formula, thus preparing and evaluating a photoelectric conversion element.

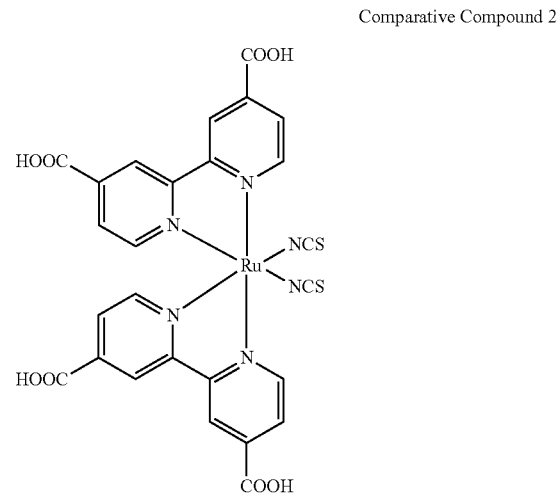

Comparative Compound 2

As a result, the open voltage is 0.61 V, the short-circuit current density is 4.0 mA/cm$^2$, the form factor is 0.59, and the conversion efficiency is 1.44%. The conversion efficiency is lower than the photosensitizing compounds according to embodiments of the invention.

The evaluation results are shown in Table 1. The photoelectric conversion elements according to embodiments the invention deliver good results.

TABLE 1

|  | Photosensitizing Compound | Open Voltage (V) | Short-circuit Current Density (mA/cm$^2$) | Form Factor | Conversion Efficiency (%) |
| --- | --- | --- | --- | --- | --- |
| Example 1 | Exemplary Compound 1 | 0.65 | 6.7 | 0.58 | 2.53 |
| Example 2 | Exemplary Compound 2 | 0.63 | 9.3 | 0.55 | 3.22 |
| Example 3 | Exemplary Compound 3 | 0.67 | 10.2 | 0.56 | 3.83 |
| Example 4 | Exemplary Compound 4 | 0.62 | 5.2 | 0.51 | 1.64 |
| Example 5 | Exemplary Compound 6 | 0.59 | 11.1 | 0.54 | 3.54 |
| Example 6 | Exemplary Compound 8 | 0.69 | 9.8 | 0.52 | 3.52 |
| Example 7 | Exemplary Compound 9 | 0.62 | 9.2 | 0.55 | 3.14 |
| Example 8 | Exemplary Compound 10 | 0.57 | 5.1 | 0.51 | 1.48 |
| Example 9 | Exemplary Compound 14 | 0.61 | 6.3 | 0.52 | 2.00 |
| Example 10 | Exemplary Compound 16 | 0.55 | 7.3 | 0.55 | 2.21 |
| Example 11 | Exemplary Compound 3 | 0.69 | 12.2 | 0.61 | 5.13 |
| Example 12 | Exemplary Compound 16 | 0.59 | 9.2 | 0.6 | 3.26 |
| Comparative Example 1 | Comparative Compound 1 | 0.6 | 4.1 | 0.55 | 1.35 |
| Comparative Example 2 | Comparative Compound 2 | 0.61 | 4 | 0.59 | 1.44 |

Example 13

After sealing the outer periphery with an epoxy resin, the photoelectric conversion element prepared in Example 3 is put in an oven at 60° C. for 100 hours. The conversion efficiency before and after this heating treatment is 3.83% and 3.75%, respectively. The decreasing rate is 0.08%. This means that durability is excellent.

Comparative Example 3

The procedure in Example 1 is repeated except for replacing Exemplary Compound 1 with a dye Comparative Compound 3 having the following formula, thus preparing a photoelectric conversion element.

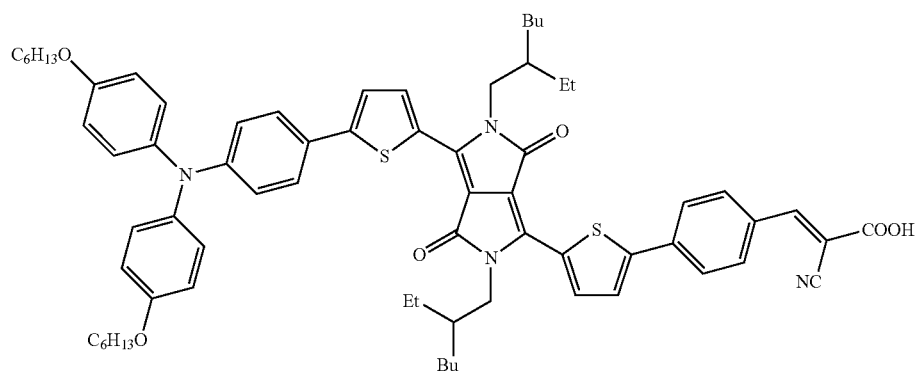

Comparative Compound 3

After sealing the outer periphery with an epoxy resin, the photoelectric conversion element is put in an oven at 60° C. for 100 hours. The conversion efficiency before and after this heating treatment is 3.91% and 1.24%, respectively. The decreasing rate is 2.67%. This means that heat durability is poor.

The results show that the photosensitizing compounds according embodiments of the noon have excellent conversion efficiency and high durability.

What is claimed is:
1. A photoelectric conversion element, comprising:
a first electrode, the first electrode covered with an electron transport layer, the electron transport layer covered with a material represented by the following formula (1):

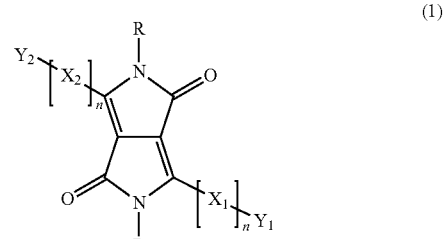

wherein R represents a straight-chain or branched-chain alkyl group, each of $X_1$ and $X_2$ independently represents a substituted or unsubstituted aromatic group, each of $Y_1$ and $Y_2$ independently represents an acidic group or hydrogen atom but at least one of $Y_1$ and $Y_2$ represents an acidic group, and n represents an integer of from 1 to 3; and a second electrode, the second electrode facing the electron transport layer, wherein the material represented by the formula (1) is a material represented by the following formula (2):

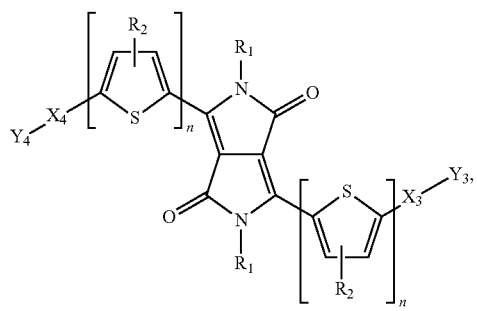
(2)

wherein each of $R_1$ and $R_2$ independently represents a straight-chain or branched-chain alkyl group; each of $X_3$ and $X_4$ independently represents a substituted or unsubstituted arylene group or hydrogen atom; each of $Y_3$ and $Y_4$ independently represents an acidic group or hydrogen atom but at least one of $Y_3$ and $Y_4$ represents an acidic group; the acidic group is selected from the group consisting of Y-1, Y-2, Y-3, Y-4, and Y-5 represented by the following formulae:

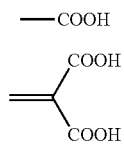
Y-1
Y-2

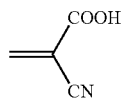
Y-3

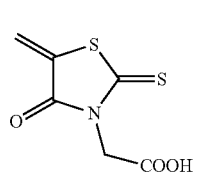
Y-4

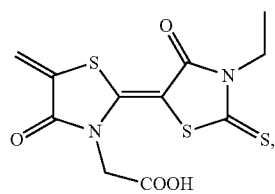
Y-5 where n represents an integer of from 1 to 3; when $X_3$ represents hydrogen atom, $Y_3$ represents nothing; and when $X_4$ represents hydrogen atom, $Y_4$ represents nothing, wherein the material represented by the formula (2) is a material represented by the following formula (3):

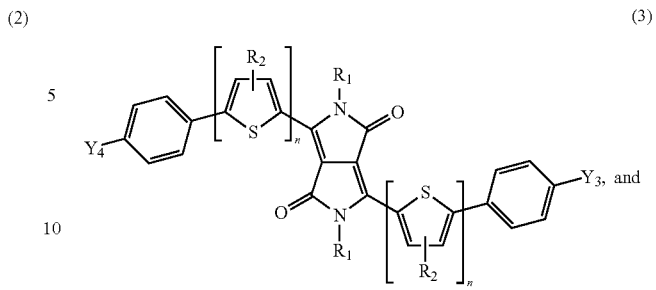
(3)

wherein each of $R_1$ and $R_2$ independently represents a straight-chain or branched-chain alkyl group; each of $Y_3$ and $Y_4$ independently represents the acidic group: and n represents an integer of from 1 to 3.

2. A photoelectric conversion element, comprising:
a first electrode, the first electrode covered with an electron transport layer, the electron transport layer covered with a material represented by the following formula (1):

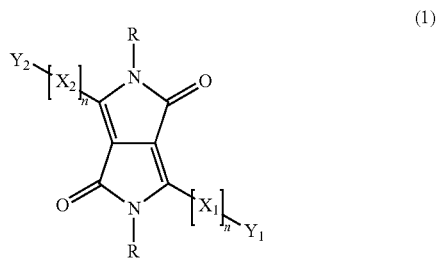
(1)

wherein R represents a straight-chain or branched-chain alkyl group, each of $X_1$ and $X_2$ independently represents a substituted or unsubstituted aromatic group, each of $Y_1$ and $Y_2$ independently represents an acidic group or hydrogen atom but at least one of $Y_1$ and $Y_2$ represents an acidic group, and n represents an integer of from 1 to 3; and a second electrode, the second electrode facing the electron transport layer, wherein the material represented by the formula (1) is a material represented by the following formula (2):

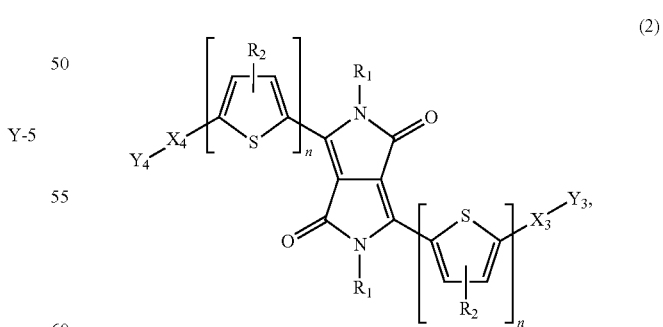
(2)

wherein each of $R_1$ and $R_2$ independently represents a straight-chain or branched-chain alkyl group; each of $X_3$ and $X_4$ independently represents a substituted or unsubstituted arylene group or hydrogen atom; each of $Y_3$ and $Y_4$ independently represents an acidic group or hydrogen atom but at least one of $Y_3$ and $Y_4$ represents an acidic group; the acidic group is selected from the group consisting of Y-1, Y-2, Y-3, Y-4, and Y-5 represented by the following formulae:

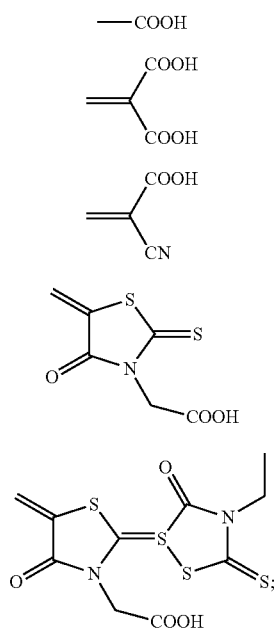

where n represents an integer of from 1 to 3; when $X_3$ represents hydrogen atom, $Y_3$ represents nothing; and when $X_4$ represents hydrogen atom, $Y_4$ represents nothing, wherein the material represented by the formula (2) is a material represented by the following formula (4):

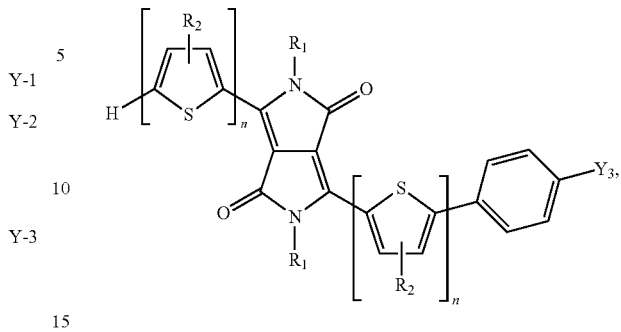

wherein each of $R_1$ and $R_2$ independently represents a straight-chain or branched-chain alkyl group; $Y_3$ represents the acidic group; and n represents an integer of from 1 to 3.

3. The photoelectric conversion element according to claim 1, wherein the electron transport layer includes an n-type oxide semiconductor consisting of nanoparticles.

4. The photoelectric conversion element according to claim 3, wherein the n-type oxide semiconductor includes at least one material selected from the group consisting of titanium oxide, zinc oxide, tin oxide, and niobium oxide.

5. The photoelectric conversion element according to claim 2, wherein the electron transport layer includes an n-type oxide semiconductor consisting of nanoparticles.

6. The photoelectric conversion element according to claim 5, wherein the n-type oxide semiconductor includes at least one material selected from the group consisting of titanium oxide, zinc oxide, tin oxide, and niobium oxide.

\* \* \* \* \*